«12» United States Patent
Park et al.

(10) Patent No.: US 9,275,834 B1
(45) Date of Patent: Mar. 1, 2016

(54) SELECTIVE TITANIUM NITRIDE ETCH

(71) Applicant: Applied Materials, Inc., Santa Clara, CA (US)

(72) Inventors: Seung Park, San Jose, CA (US); Mikhail Korolik, San Jose, CA (US); Anchuan Wang, San Jose, CA (US); Nitin K. Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/627,991

(22) Filed: Feb. 20, 2015

(51) Int. Cl.
 H01L 21/3065 (2006.01)
 H01J 37/32 (2006.01)

(52) U.S. Cl.
 CPC ....... *H01J 37/32009* (2013.01); *H01J 37/3244* (2013.01); *H01L 21/3065* (2013.01)

(58) Field of Classification Search
 None
 See application file for complete search history.

(56) References Cited

U.S. PATENT DOCUMENTS

| 6,924,189 | B2 * | 8/2005 | Kwon | H01L 28/91 257/E21.019 |
| 8,940,642 | B2 * | 1/2015 | Nemani | H01L 21/3105 438/710 |
| 8,951,429 | B1 * | 2/2015 | Liu | H01J 37/32449 216/67 |
| 8,956,980 | B1 * | 2/2015 | Chen | H01L 21/31116 216/79 |
| 2005/0112876 | A1 * | 5/2005 | Wu | C23C 16/34 438/685 |
| 2005/0287755 | A1 * | 12/2005 | Bachmann | H01L 27/0805 438/381 |
| 2014/0166617 | A1 * | 6/2014 | Chen | H01L 21/31122 216/67 |
| 2014/0256131 | A1 * | 9/2014 | Wang | H01L 21/32136 438/676 |
| 2014/0273489 | A1 * | 9/2014 | Wang | H01L 21/6708 438/716 |
| 2014/0302680 | A1 * | 10/2014 | Singh | H01L 21/3065 438/710 |
| 2014/0342532 | A1 * | 11/2014 | Zhu | H01L 21/3105 438/476 |

FOREIGN PATENT DOCUMENTS

JP    2000049111 A  *  2/2000

* cited by examiner

*Primary Examiner* — Anita Alanko
(74) *Attorney, Agent, or Firm* — Kilpatrick Townsend & Stockton LLP

(57) ABSTRACT

A method of removing titanium nitride is described. The silicon nitride resides on a patterned substrate. The titanium nitride is removed with a gas-phase etch using plasma effluents formed in a remote plasma from a fluorine-containing precursor, a nitrogen-and-hydrogen-containing precursor and an oxygen-containing precursor. Plasma effluents within the remote plasma are flowed into a substrate processing region where the plasma effluents react with the titanium nitride.

15 Claims, 6 Drawing Sheets

SELECTIVE TITANIUM NITRIDE ETCH

FIELD

The subject matter herein relates to removing titanium nitride.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which etches one material faster than another helping e.g. a pattern transfer process proceed. Such an etch process is said to be selective of the first material relative to the second material. As a result of the diversity of materials, circuits and processes, etch processes have been developed with a selectivity towards a variety of materials.

Dry etch processes are often desirable for selectively removing material from semiconductor substrates. The desirability stems from the ability to gently remove material from miniature structures with minimal physical disturbance. Dry etch processes also allow the etch rate to be abruptly stopped by removing the gas phase reagents. Some dry-etch processes involve the exposure of a substrate to remote plasma by-products formed from one or more precursors to achieve high etch selectivity. The high selectivities achieved enable novel process sequences.

Methods are needed to enhance the etch selectivities of various materials and to broaden the suite of materials which the selective etch does not etch or etches very slowly.

SUMMARY

A method of removing titanium nitride is described. The titanium nitride resides on a patterned substrate. The titanium nitride is removed with a gas-phase etch using plasma effluents formed in a remote plasma from a fluorine-containing precursor, a nitrogen-and-hydrogen-containing precursor and an oxygen-containing precursor. Plasma effluents within the remote plasma are flowed into a substrate processing region where the plasma effluents react with the the titanium nitride.

Embodiments include methods of removing titanium nitride from a patterned substrate. The methods include placing the patterned substrate in a substrate processing region of a substrate processing chamber. The methods further include flowing a fluorine-containing precursor, an oxygen-containing precursor and a nitrogen-and-hydrogen-containing precursor into a remote plasma region fluidly coupled to the substrate processing region while forming a remote plasma in the remote plasma region to produce plasma effluents. The methods further include flowing the plasma effluents into the substrate processing region through through-holes in a showerhead disposed between the substrate processing region and the remote plasma region. The methods further include etching the titanium nitride with the plasma effluents.

Embodiments include methods of etching titanium nitride from a patterned substrate. The methods include placing the patterned substrate in a substrate processing region of a substrate processing chamber. The patterned substrate has an exposed titanium nitride portion and a titanium-free portion. The methods further include flowing a radical-fluorine precursor, a radical-oxygen precursor and a radical-nitrogen-hydrogen precursor into the substrate processing region. The methods further include etching the exposed titanium nitride portion such that the exposed titanium nitride portion etches more rapidly than the titanium-free portion by an etch selectivity ratio of more than 10:1. The methods further include exposing the titanium-free portion.

Embodiments include methods of removing titanium nitride from a patterned substrate. The methods include placing the patterned substrate in a substrate processing region of a substrate processing chamber. The patterned substrate includes an exposed titanium nitride portion overlying a silicon nitride portion. The methods further include flowing a fluorine-containing precursor, an oxygen-containing precursor and a nitrogen-and-hydrogen-containing precursor into a remote plasma region fluidly coupled to the substrate processing region while forming a remote plasma in the remote plasma region to produce plasma effluents. The methods further include flowing the plasma effluents into the substrate processing region through through-holes in a showerhead disposed between the substrate processing region and the remote plasma region. The methods further include etching the titanium nitride with the plasma effluents. The methods further include etching the titanium nitride with the plasma effluents. The methods further include removing the exposed titanium nitride portion and a titanium silicide portion to expose the silicon nitride portion. The titanium silicide portion may include titanium, nitrogen and silicon.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

DESCRIPTION OF THE DRAWINGS

A further understanding of the nature and advantages of the embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

A method of removing titanium nitride is described. The titanium nitride resides on a patterned substrate. The titanium nitride is removed with a gas-phase etch using plasma effluents formed in a remote plasma from a fluorine-containing precursor, a nitrogen-and-hydrogen-containing precursor and an oxygen-containing precursor. Plasma effluents within the remote plasma are flowed into a substrate processing region where the plasma effluents react with the the titanium nitride.

Selectively etching titanium nitride is beneficial in a variety of device process flows including in the formation of dynamic random access memory (DRAM), FinFETs and many other devices. The titanium nitride may be employed as a barrier layer to inhibit diffusion but still allow significant conductivity when combined with a conductor in the form of a line or via. Some prior art process have used remotely excited nitrogen trifluoride and remotely excited or unexcited hydrogen ($H_2$) to selectively etch titanium nitride relative to silicon oxide. A benefit of the present embodiments include etching titanium nitride selectively relative to additional materials such as silicon, and particularly silicon nitride and metals/conductors such as aluminum and copper. The etch of the titanium nitride is accomplished herein in a manner from the methods used previously. The present embodiments may include remotely exciting a fluorine-containing precursor, a nitrogen-and-hydrogen-containing precursor and an oxygen-containing precursor. The plasma effluents are then flowed into the substrate processing region to selectively etch the titanium nitride. Besides the additional breadth in material selectivity, a benefit of the present embodiments include a starkly broader process window which provides for a more stable and manufacturing-friendly etch process. A further benefit of the methods described herein include avoiding the formation of pits on the surfaces of some materials such as silicon nitride and silicon.

Figure 1:
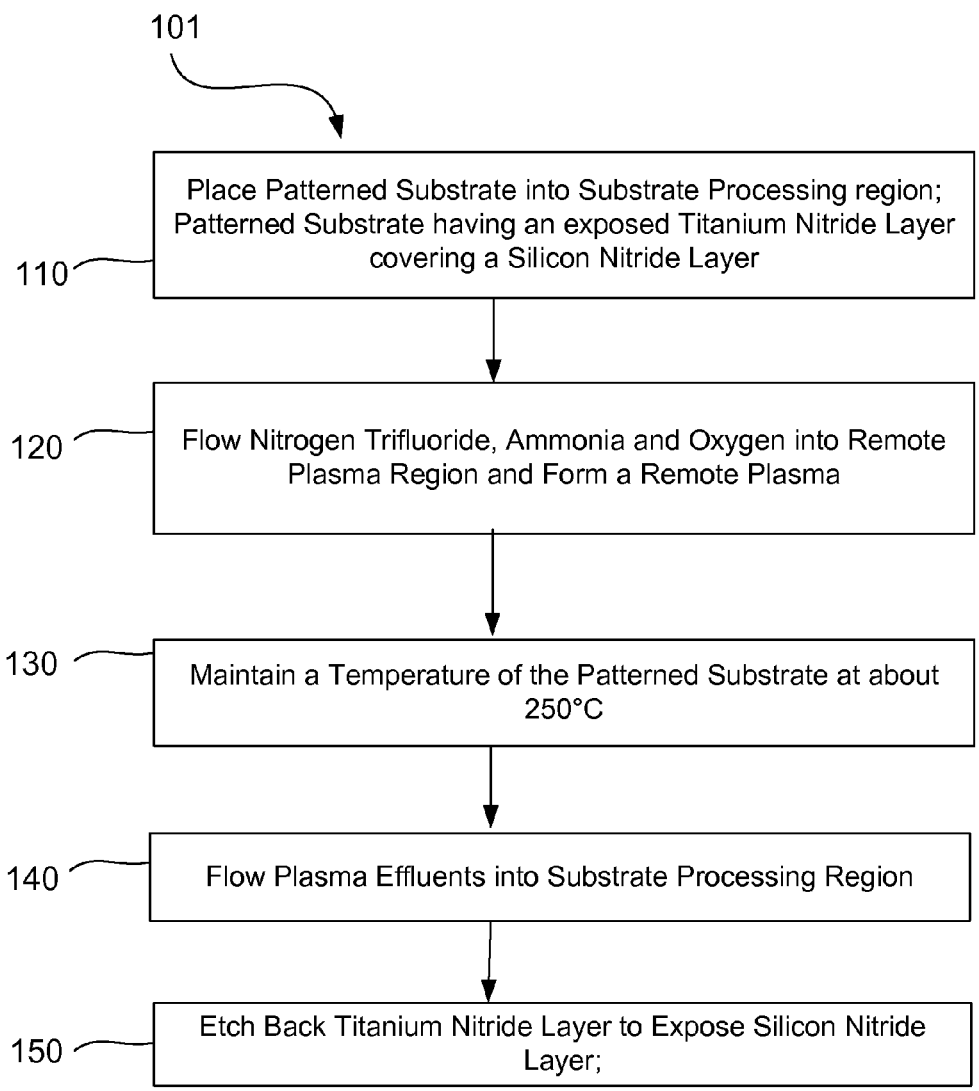
FIG. 1 is a flow chart of a titanium nitride etch process according to embodiments.

To better understand and appreciate the embodiments described herein, reference is now made to FIG. 1 which is a titanium nitride etch process 101 according to embodiments. Prior to the first operation, an exposed titanium nitride portion is formed on the patterned substrate as mask on top of a stack of materials to be used as a hardmask. "Top", "above" and "up" will be used herein to describe portions/directions perpendicularly distal from the substrate plane and further away from the major plane of the substrate in the perpendicular direction. "Vertical" will be used to describe items aligned in the "up" direction towards the "top". Other similar terms may be used whose meanings will now be clear. Alternatively or in combination, titanium nitride may be used in other geometries as a diffusion barrier. In this example, there is a silicon nitride portion on the patterned substrate beneath the exposed portion of titanium nitride.

A fluorine-containing precursor (e.g. $NF_3$) is flowed into a plasma region separate from the processing region (operation 120). The separate plasma region may be referred to as a remote plasma region herein and may be within a distinct module from the processing chamber or a compartment within the processing chamber. A nitrogen-and-hydrogen-containing precursor, such as $NH_3$, and an oxygen-containing precursor, such as $O_2$, are also flowed into the remote plasma region and excited along with the fluorine-containing precursor in a remote plasma.

The substrate temperature is maintained at about 250° C. (operation 130) and the plasma effluents formed in the remote plasma region are flowed into the substrate processing region in operation 140. The exposed titanium nitride portion is selectively etched relative to the silicon nitride portion in operation 150. The nitrogen-and-hydrogen-containing precursor is helpful in enhancing the etch selectivity and may assist in removing oxidation (if present) on the titanium nitride portion (e.g. titanium oxide) according to embodiments. The exposed titanium nitride portion may still be referred to as exposed despite having a thin oxidation layer.

In another example, an exposed tungsten portion may be present on the patterned substrate as a conductor (e.g. a vertical via). The fluorine-containing precursor, the nitrogen-and-hydrogen-containing precursor and the oxygen-containing precursor are flowed into the remote plasma region and excited all together in the remote plasma. The substrate temperature is again maintained at about 250° C. and the plasma effluents formed in the remote plasma region are flowed into the substrate processing region. The exposed titanium nitride portion is selectively etched relative to the tungsten portion. The exposed tungsten portion may be referred to as exposed whether or not the tungsten portion has a thin oxidation layer.

Regardless of the types of exposed material, the etching operation (e.g. operation 150 above) may involve removal or complete removal of the exposed titanium nitride portion in embodiments. The selective etch of all examples disclosed herein may etch titanium nitride significantly faster than a variety of titanium-free dielectric materials which may include hafnium oxide ($HfO_2$) or a silicon-containing material such as silicon (e.g. polysilicon), silicon oxide, low-K dielectric, silicon nitride or silicon carbon nitride according embodiments. Such a process may have broad-based utility, for example, the etch processes disclosed herein may be used to selectively remove titanium nitride from above a silicon-containing film stack after patterning. The selective etch of all embodiments described may be selective of titanium nitride relative to a metal-containing film or a metal film according to embodiments. The selective etch may be selective of titanium nitride relative to, for example, aluminum, aluminum oxide, copper, copper oxide, tungsten, tungsten oxide, nickel, nickel oxide, hafnium, hafnium oxide.

Figure 2A:
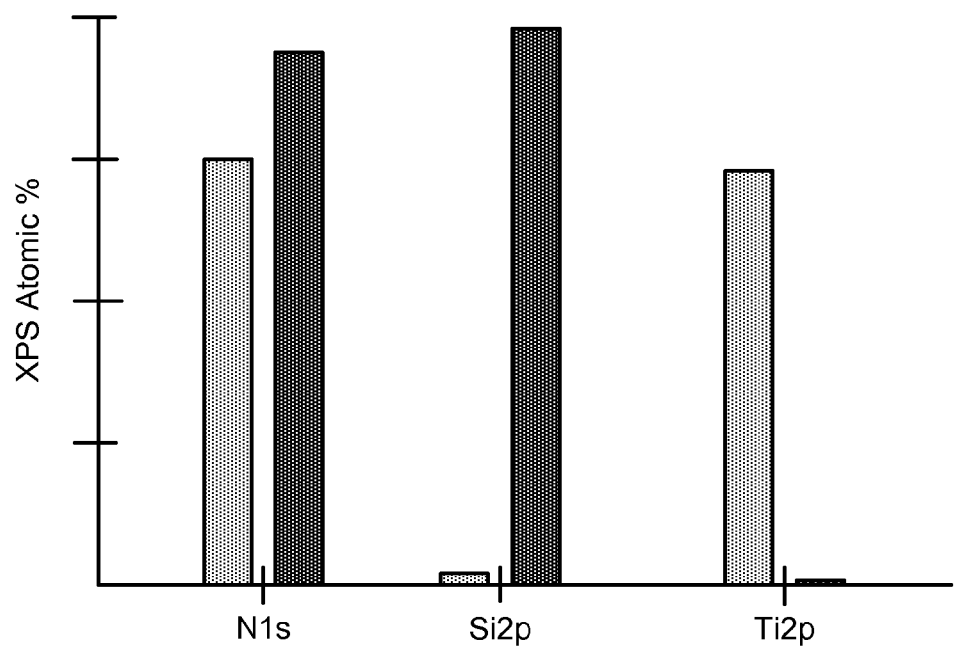
FIGS. 2A and 2B are bar charts of atomic concentrations before and after an exemplary titanium nitride etch process according to embodiments.
Figure 2B:
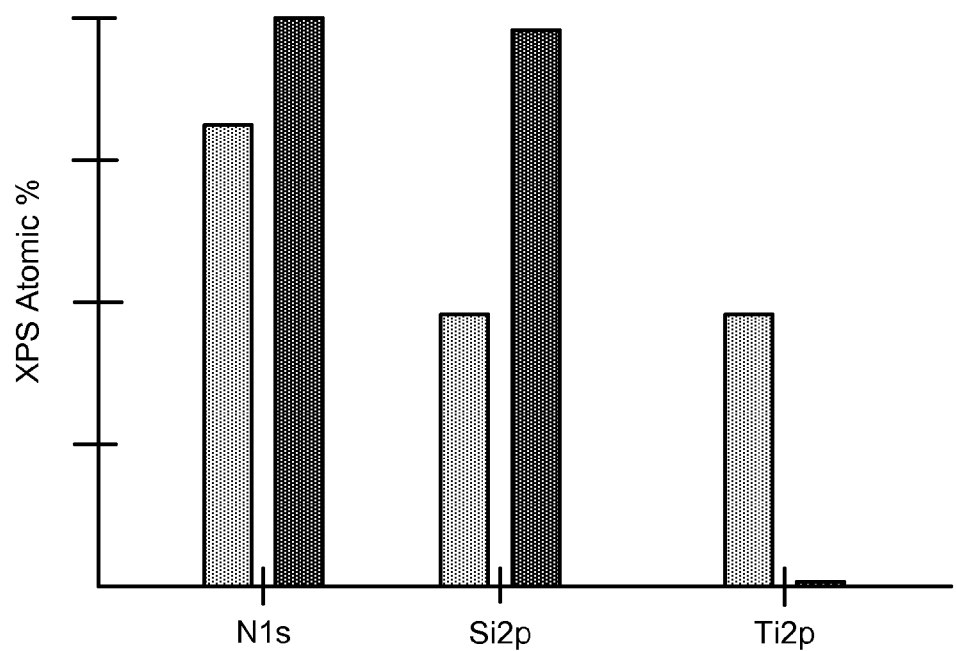

Reference will now be made to FIG. 2A and FIG. 2B which are bar charts of atomic concentrations of a film before and after titanium nitride etch process 101 as determined by x-ray photoelectron spectroscopy (XPS). FIG. 2A shows atomic concentrations of nitrogen, silicon and titanium of a 100 Å titanium nitride portion prior to titanium nitride etch process 101 as shown in the light bars. The dark bars indicate atomic concentration of nitrogen, silicon and titanium after the 100 Å titanium nitride portion has been etched by titanium nitride etch process 101. Titanium nitride etch process 101 removes essentially all titanium nitride even when an alloyed titanium silicide layer may be present at the interface. Therefore a further benefit of the methods presented herein are the removal of titanium silicide interfacial layers to allow the formation of a more pristine silicon nitride interface following the etch process. FIG. 2B shows a thinner layer which represents a titanium silicide layer more directly. Atomic concentrations of nitrogen, silicon and titanium of a 25 Å titanium silicon nitrogen (a titanium silicide) portion prior to titanium nitride etch process 101 are shown in the light bars. The dark bars indicate atomic concentration of nitrogen, silicon and titanium after the titanium nitride etch process 101. The titanium is reduced to less than half, one or two percent of the remaining film as measured using XPS according to embodiments.

Titanium nitride etch process 101 may include an additional operation following operation 150 (or included in operation 150) involving the removal of a titanium silicide portion. The titanium silicide portion may be disposed between the exposed titanium nitride portion and the titanium-free portion. The titanium silicide portion is in direct contact with the exposed titanium nitride portion and the titanium-free portion. The operation of etching the titanium silicide portion may occur after etching the exposed titanium nitride portion and before exposing the titanium-free portion.

The fluorine-containing precursor has been combined, as described, with two new precursors which include the nitrogen-and-hydrogen-containing precursor and the oxygen-containing precursor. The influence of these two precursors on the selectivity has been studied and the results regarding silicon are described now as an example. Modestly increasing the flow rate of ammonia, a suitable example of the nitrogen-and-hydrogen-containing precursor, from 120 sccm to 150 sccm increased the etch rate of titanium nitride of the described processes by a factor of five (up to 1:1) at a process pressure of 3 Torr in the substrate processing region. Increasing the flow rate of ammonia from 120 sccm to 170 sccm increased the etch rate of titanium nitride of the described processes by a factor of over twenty at a process pressure of 6 Torr in the substrate processing region. Without the oxygen-containing precursor, however, the net selectivity did not significantly exceed a 1:1 ratio meaning the titanium nitride and the silicon etched at about the same rate in the best possible case. The influence of the oxygen-containing precursor in combination with the nitrogen-and-hydrogen-containing precursor had a more dramatic influence. At a medium flow rate of nitrogen-and-hydrogen-containing precursor (and a 6 Torr process pressure), the flow rate of the oxygen-containing precursor was changed from none to 50 sccm. The etch selectivity of the titanium nitride relative to the silicon increased from silicon etching faster all the way to an etch selectivity exceeding 25:1. Analogous results were found for metal-containing films and silicon nitride.

In operation 120, the fluorine-containing precursor, the oxygen-containing precursor and the nitrogen-and-hydrogen-containing precursor are flowed into the remote plasma region. The fluorine-containing precursor may comprise or consist of one or more of F, $F_2$, $BrF_3$, $ClF_3$, $NF_3$, HF, $SF_6$ and $XeF_2$. The oxygen-containing precursor may comprise or consist of one or more of $O_2$, O, $O_3$ or $H_2O$. The oxygen-containing precursor may consist of oxygen in embodiments. The nitrogen-and-hydrogen-containing precursor may comprise or consist of one or more of $NH_3$, $N_2H_4$ or $N_2H_2$ according to embodiments. The nitrogen-and-hydrogen-containing precursor may be $N_xH_y$ where x and y are integers in embodiments. The nitrogen-and-hydrogen-containing precursor may consist of nitrogen and hydrogen according to embodiments. The nitrogen-and-hydrogen-containing precursor and the oxygen-containing precursor may be included with the fluorine-containing precursor in operation 120 to help achieve greater etch selectivity to a wider variety of materials than etch processes disclosed in the past. The nitrogen-and-hydrogen-containing precursor may contain only single bonds in embodiments.

In operation 150, the titanium nitride etch selectivity of the processes disclosed herein may be more than 10:1, more than 20:1, more than 50:1, or more than 100:1 for materials other than titanium nitride in embodiments. The processes disclosed herein display etch selectivities of titanium nitride relative to a variety of specific materials. In practice, etch rates of many of these materials were so low as to be not accurately measurable. The etch selectivity of titanium nitride relative to silicon oxide may be more than 100:1, more than 250:1, more than 500:1 or more than 1000:1 in embodiments. The etch selectivity of titanium nitride relative to silicon may be more than 50:1, more than 100:1, more than 200:1 or more than 300:1 in embodiments. The etch selectivity of titanium nitride and relative to silicon nitride may be more than 25:1, more than 50:1, more than 75:1 or more than 100:1 according to embodiments. The etch selectivity of titanium nitride relative to metal silicide (e.g. titanium silicide, tantalum silicide or tungsten silicide) may be more than 100:1, more than 250:1, more than 500:1 or more than 1000:1 in embodiments. The etch selectivity of titanium nitride relative to a metal layer (e.g. tungsten, copper or aluminum) may be more than 100:1, more than 250:1, more than 500:1 or more than 1000:1 according to embodiments. The etch selectivity of titanium nitride relative to a metal oxide layer (e.g. tungsten oxide, aluminum oxide or hafnium oxide) may be more than 80:1, more than 200:1, more than 400:1 or more than 800:1 according to embodiments.

Also in operation 120, the fluorine-containing precursor (e.g. $NF_3$) is supplied at a flow rate of between about 25 sccm (standard cubic centimeters per minute) and 800 sccm, the oxygen-containing precursor (e.g. $O_2$) is supplied at a flow rate of between about 5 sccm and 200 sccm, the nitrogen-and-hydrogen-containing precursor (e.g. $NH_3$) at a flow rate of between about 25 sccm and 500 sccm, He at a flow rate of between about 0 slm (standard liters per minute) and 3 slm, and Ar at a flow rate of between about 0 slm and 3 slm. One of ordinary skill in the art would recognize that other gases and/or flows may be used depending on a number of factors including processing chamber configuration, substrate size, geometry and layout of features being etched.

During etching operations 120-150, the substrate may be between 30° C. and 500° C., between 50° C. and 450° C., 100° C. and 400° C., between 150° C. and 350° C. or between 200° C. and 300° C. in embodiments. The pressure in the substrate processing region and the remote plasma region(s) during etching operations 120-150 may be between 0.1 Torr and 50 Torr, between 1 Torr and 15 Torr or between 3 Torr and 10 Torr according to embodiments. The etch selectivity was found to increase for increasing substrate temperature within the substrate temperature regimes described herein.

The flows of the fluorine-containing precursor, the oxygen-containing precursor and the nitrogen-and-hydrogen-containing precursor may further include one or more relatively inert gases such as He, $N_2$, Ar. The inert gas can be used to improve plasma stability or process uniformity. Argon is helpful, as an additive, to promote the formation of a stable plasma. Process uniformity is generally increased when helium is included. These additives are present in embodiments throughout this specification. Flow rates and ratios of the different gases may be used to control etch rates and etch selectivity.

The method also includes applying energy to the fluorine-containing precursor, the nitrogen-and-hydrogen-containing precursor and the oxygen-containing precursor (operation 120) in the remote plasma region to generate the plasma effluents. As would be appreciated by one of ordinary skill in the art, the plasma may include a number of charged and neutral species including radicals and ions. The plasma in the remote plasma region (e.g. in the chamber plasma region) may be generated using known techniques (e.g., radio frequency excitations, capacitively-coupled power, inductively coupled power, etc.). In an embodiment, the energy is applied using a capacitively-coupled plasma unit. The remote plasma source power may be between about 30 watts and about 1500 watts, between about 50 watts and about 1200 watts, between about 100 watts and about 1000 watts, or between about 150 watts and about 800 watts in embodiments. The capacitively-coupled plasma unit may be disposed remote from the substrate processing region but still within the substrate processing chamber. For example, the capacitively-coupled plasma unit and the plasma generation region may be separated from the gas reaction region by a showerhead. Alternatively, The remote plasma power may be applied to the remote plasma region at a level between 500 W and 10 kW for a remote plasma external to the substrate processing chamber. The remote plasma power may be applied using inductive coils, in embodiments, in which case the remote plasma will be referred to as an inductively-coupled plasma (ICP). No local plasma may be applied to the substrate processing region during operations 110-150 according to embodiments, in other words, the substrate processing region may be plasma-free.

An ion suppressor (which may be the showerhead or a separate entity) may be used to provide radical and/or neutral species for gas-phase etching. The ion suppressor may also be referred to as an ion suppression element. In embodiments, for example, the ion suppressor is used to filter etching plasma effluents en route from the remote plasma region to the substrate processing region. The ion suppressor may be used to provide a reactive gas having a higher concentration of radicals than ions. Plasma effluents pass through the ion suppressor disposed between the remote plasma region and the substrate processing region. The ion suppressor functions to dramatically reduce or substantially eliminate ionic species traveling from the plasma generation region to the substrate. The ion suppressors described herein are simply one way to achieve a low electron temperature in the substrate processing region during the gas-phase etch processes described herein.

In embodiments, an electron beam is passed through the substrate processing region in a plane parallel to the substrate to reduce the electron temperature of the plasma effluents. A simpler showerhead may be used if an electron beam is applied in this manner. The electron beam may be passed as a laminar sheet disposed above the substrate in embodiments. The electron beam provides a source of neutralizing negative charge and provides a more active means for reducing the flow of positively charged ions towards the substrate and increasing the etch selectivity in embodiments. The flow of plasma effluents and various parameters governing the operation of the electron beam may be adjusted to lower the electron temperature measured in the substrate processing region.

The electron temperature may be measured using a Langmuir probe in the substrate processing region during excitation of a plasma in the remote plasma. The electron temperature may be less than 0.5 eV, less than 0.45 eV, less than 0.4 eV, or less than 0.35 eV. These extremely low values for the electron temperature are enabled by the presence of the electron beam, showerhead and/or the ion suppressor. Uncharged neutral and radical species may pass through the electron beam and/or the openings in the ion suppressor to react at the substrate. Such a process using radicals and other neutral species can reduce plasma damage compared to conventional plasma etch processes that include sputtering and bombardment. Embodiments are also advantageous over conventional wet etch processes where surface tension of liquids can cause bending and peeling of small features.

The substrate processing region may be described herein as "plasma-free" during the etch processes described herein. "Plasma-free" does not necessarily mean the region is devoid of plasma. Ionized species and free electrons created within the plasma region may travel through pores (apertures) in the partition (showerhead) at exceedingly small concentrations. The borders of the plasma in the chamber plasma region may encroach to some small degree upon the substrate processing region through the apertures in the showerhead. Furthermore, a low intensity plasma may be created in the substrate processing region without eliminating desirable features of the etch processes described herein. All causes for a plasma having much lower intensity than the chamber plasma region during the creation of the excited plasma effluents do not deviate from the scope of "plasma-free" as used herein.

Figure 3A:
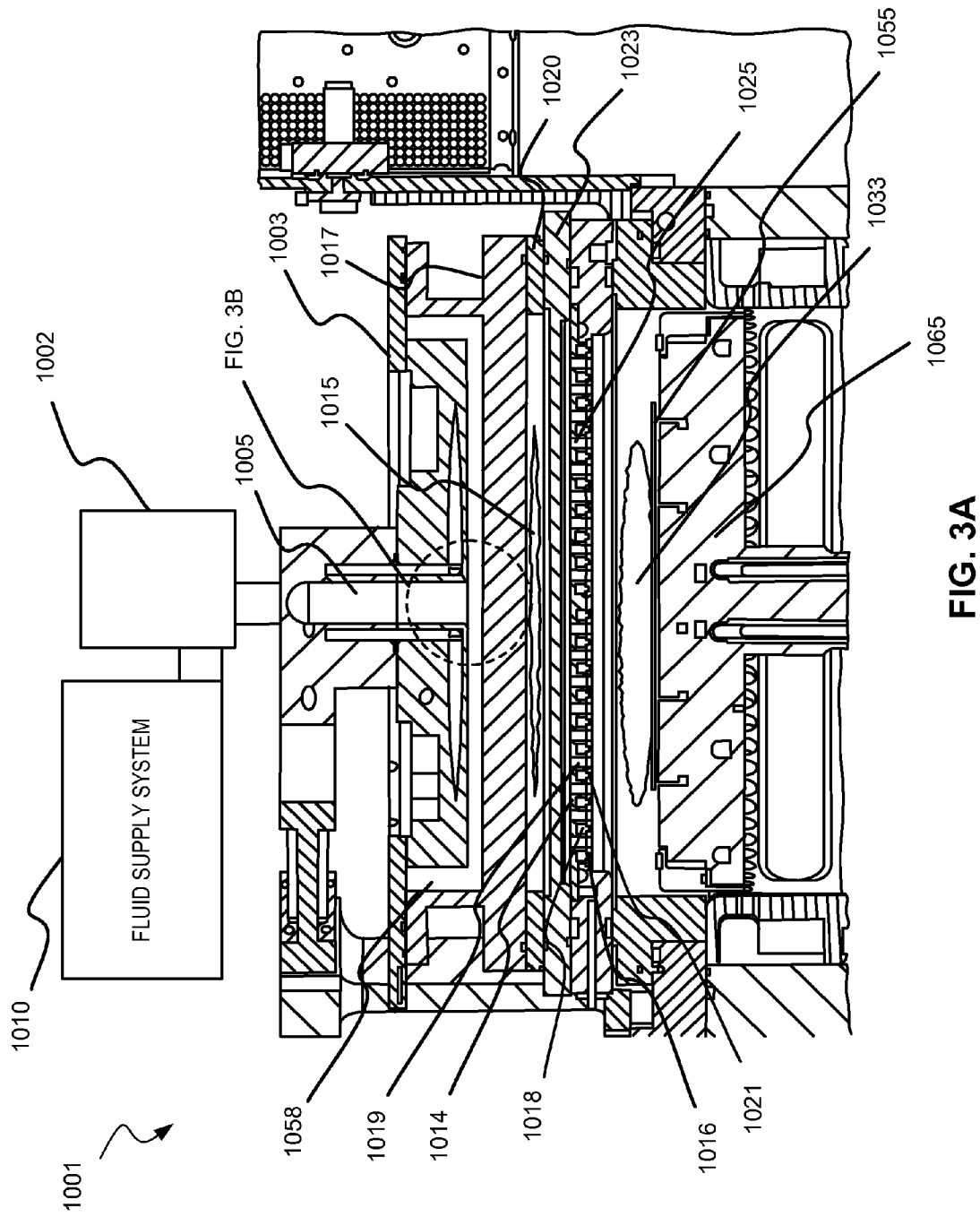
FIG. 3A shows a schematic cross-sectional view of a substrate processing chamber according to embodiments.

FIG. 3A shows a cross-sectional view of an exemplary substrate processing chamber 1001 with a partitioned plasma generation region within the processing chamber. During film etching, a process gas may be flowed into chamber plasma region 1015 through a gas inlet assembly 1005. A remote plasma system (RPS) 1002 may optionally be included in the system, and may process a first gas which then travels through gas inlet assembly 1005. The process gas may be excited within RPS 1002 prior to entering chamber plasma region 1015. Accordingly, the fluorine-containing precursor as discussed above, for example, may pass through RPS 1002 or bypass the RPS unit in embodiments.

A cooling plate 1003, faceplate 1017, ion suppressor 1023, showerhead 1025, and a substrate support 1065 (also known as a pedestal), having a substrate 1055 disposed thereon, are shown and may each be included according to embodiments. Pedestal 1065 may have a heat exchange channel through which a heat exchange fluid flows to control the temperature of the substrate. This configuration may allow the substrate 1055 temperature to be cooled or heated to maintain relatively low temperatures, such as between −20° C. to 200° C. Pedestal 1065 may also be resistively heated to relatively high temperatures, such as between 100° C. and 1100° C., using an embedded heater element.

Exemplary configurations may include having the gas inlet assembly 1005 open into a gas supply region 1058 partitioned from the chamber plasma region 1015 by faceplate 1017 so that the gases/species flow through the holes in the faceplate 1017 into the chamber plasma region 1015. Structural and operational features may be selected to prevent significant backflow of plasma from the chamber plasma region 1015 back into the supply region 1058, gas inlet assembly 1005, and fluid supply system 1010. The structural features may include the selection of dimensions and cross-sectional geometries of the apertures in faceplate 1017 to deactivate back-streaming plasma. The operational features may include maintaining a pressure difference between the gas supply region 1058 and chamber plasma region 1015 that maintains a substantially unidirectional flow of plasma through the showerhead 1025. The faceplate 1017, or a conductive top portion of the chamber, and showerhead 1025 are shown with an insulating ring 1020 located between the features, which allows an AC potential to be applied to the faceplate 1017 relative to showerhead 1025 and/or ion suppressor 1023. The insulating ring 1020 may be positioned between the faceplate 1017 and the showerhead 1025 and/or ion suppressor 1023 enabling a capacitively coupled plasma (CCP) to be formed in the chamber plasma region.

The plurality of holes in the ion suppressor 1023 may be configured to control the passage of the activated gas, i.e., the ionic, radical, and/or neutral species, through the ion suppressor 1023. For example, the aspect ratio of the holes, or the hole diameter to length, and/or the geometry of the holes may be controlled so that the flow of ionically-charged species in the activated gas passing through the ion suppressor 1023 is reduced. The holes in the ion suppressor 1023 may include a tapered portion that faces chamber plasma region 1015, and a cylindrical portion that faces the showerhead 1025. The cylindrical portion may be shaped and dimensioned to control the flow of ionic species passing to the showerhead 1025. An adjustable electrical bias may also be applied to the ion suppressor 1023 as an additional means to control the flow of ionic species through the suppressor. The ion suppression element 1023 may function to reduce or eliminate the amount of ionically charged species traveling from the plasma generation region to the substrate. Uncharged neutral and radical species may still pass through the openings in the ion suppressor to react with the substrate.

Plasma power can be of a variety of frequencies or a combination of multiple frequencies. In the exemplary processing system the plasma may be provided by plasma power delivered to faceplate 1017 relative to ion suppressor 1023 and/or showerhead 1025. Plasma powers were provided previously. The RF frequency applied in the exemplary processing system may be low RF frequencies less than about 200 kHz, high RF frequencies between about 10 MHz and about 15 MHz, or microwave frequencies greater than or about 1 GHz in embodiments. The plasma power may be capacitively-coupled (CCP) or inductively-coupled (ICP) into the remote plasma region.

A precursor, for example a fluorine-containing precursor, an oxygen-containing precursor and a nitrogen-and-hydrogen-containing precursor, may be flowed into substrate processing region 1033 by embodiments of the showerhead described herein. Excited species derived from the process gas in chamber plasma region 1015 may travel through apertures in the ion suppressor 1023, and/or showerhead 1025 and react with an additional precursor flowing into substrate processing region 1033 from a separate portion of the showerhead. Alternatively, if all precursor species are being excited in chamber plasma region 1015, no additional precursors may be flowed through the separate portion of the showerhead. Little or no plasma may be present in substrate processing region 1033 during the remote plasma etch process in embodiments. Excited derivatives of the precursors may combine in the region above the substrate and/or on the substrate to etch structures or remove species from the substrate.

The processing gases may be excited in chamber plasma region 1015 and may be passed through the showerhead 1025 to substrate processing region 1033 in the excited state. A local plasma may be formed in substrate processing region 1033, but, a plasma may not be generated in substrate processing region 1033 during the operations disclosed herein in embodiments.

Figure 3B:
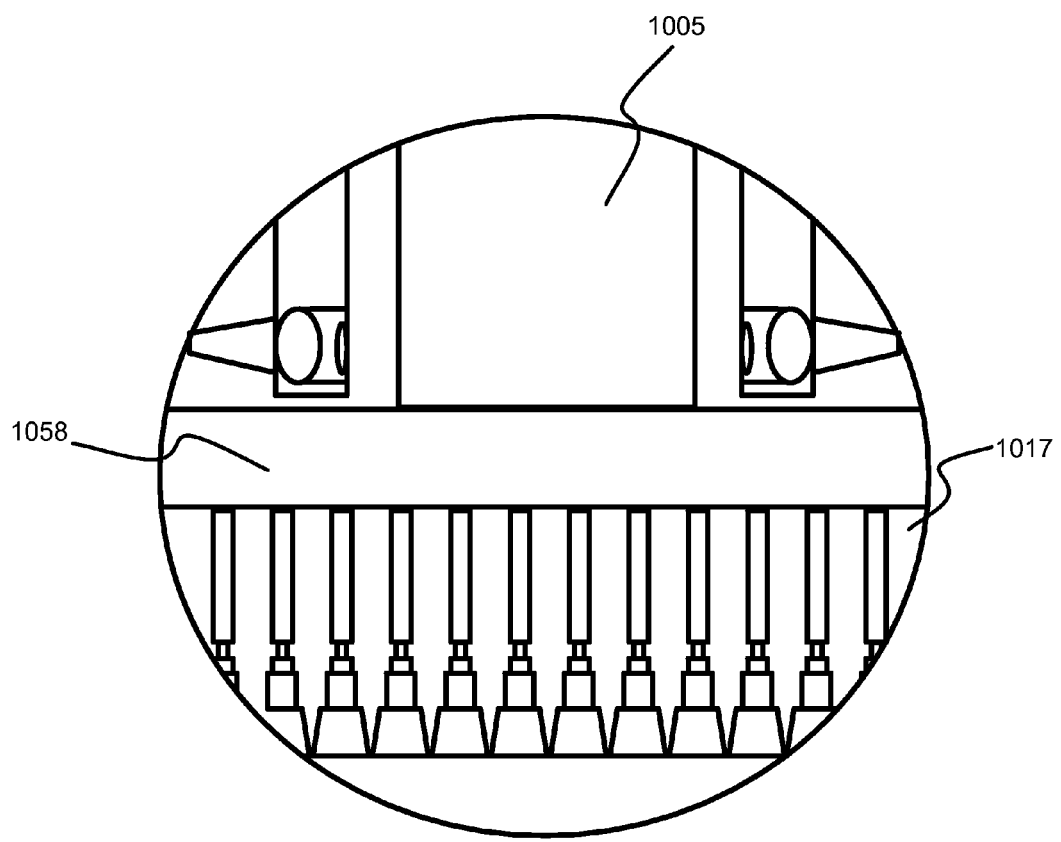
FIG. 3B shows a schematic cross-sectional view of a portion of a substrate processing chamber according to embodiments.

FIG. 3B shows a detailed view of the features affecting the processing gas distribution through faceplate 1017. The gas distribution assemblies such as showerhead 1025 for use in the processing chamber section 1001 may be referred to as dual channel showerheads (DCSH) and are additionally detailed in the embodiments described in FIG. 3A as well as FIG. 3C herein. The dual channel showerhead may provide for etching processes that allow for separation of etchants outside of the processing region 1033 to provide limited interaction with chamber components and each other prior to being delivered into the processing region.

The showerhead 1025 may comprise an upper plate 1014 and a lower plate 1016. The plates may be coupled with one another to define a volume 1018 between the plates. The coupling of the plates may be configured to provide first fluid channels 1019 through the upper and lower plates, and second fluid channels 1021 through the lower plate 1016. The formed channels may be configured to provide fluid access from the volume 1018 through the lower plate 1016 by way of second fluid channels 1021 alone, and the first fluid channels 1019 may be fluidly isolated from the volume 1018 between the plates and the second fluid channels 1021. The volume 1018 may be fluidly accessible through a side of the gas distribution assembly 1025.

Figure 3C:
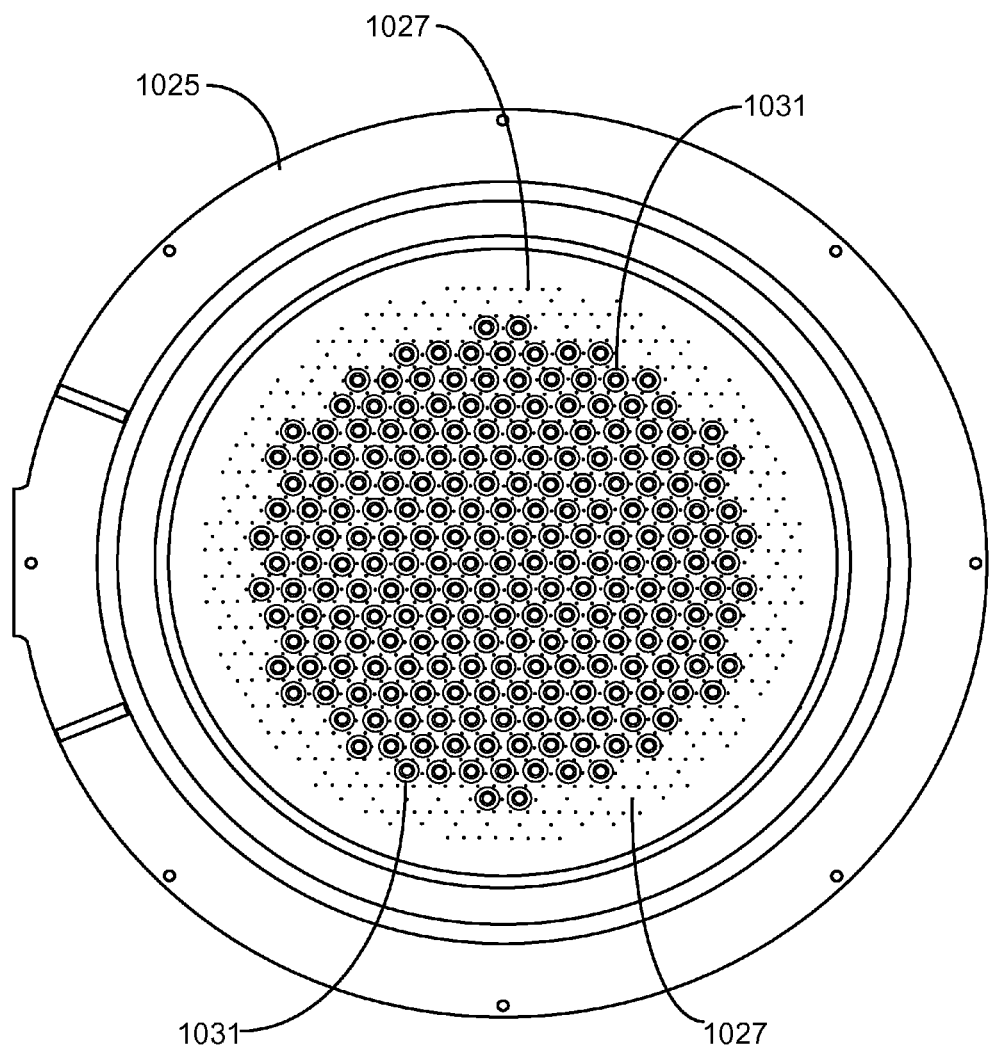
FIG. 3C shows a bottom view of a showerhead according to embodiments.

Although the exemplary system of FIGS. 3A-3C includes a dual-channel showerhead, it is understood that alternative distribution assemblies may be utilized that maintain first and second precursors fluidly isolated prior to substrate processing region 1033. For example, a perforated plate and tubes underneath the plate may be utilized, although other configurations may operate with reduced efficiency or not provide as uniform processing as the dual-channel showerhead described.

In the embodiment shown, showerhead 1025 may distribute by way of first fluid channels 1019 process gases which contain plasma effluents upon excitation by a plasma in chamber plasma region 1015. In embodiments, the process gas introduced into RPS 1002 and/or chamber plasma region 1015 may contain $NF_3$, $O_2$ and $NH_3$. The process gas may also include a carrier gas such as helium, argon, nitrogen ($N_2$), etc. Plasma effluents may include ionized or neutral derivatives of the process gas and may also be referred to herein as a radical-fluorine precursor referring to the atomic constituent of the process gas introduced.

FIG. 3C is a bottom view of a showerhead 1025 for use with a processing chamber in embodiments. Showerhead 1025 corresponds with the showerhead shown in FIG. 3A. Through-holes 1031, which show a view of first fluid channels 1019, may have a plurality of shapes and configurations to control and modify the flow of precursors through the showerhead 1025. Small holes 1027, which show a view of second fluid channels 1021, may be distributed substantially evenly over the surface of the showerhead, even amongst the through-holes 1031, which may help to provide more even mixing of the precursors as they exit the showerhead than other configurations.

Figure 4:
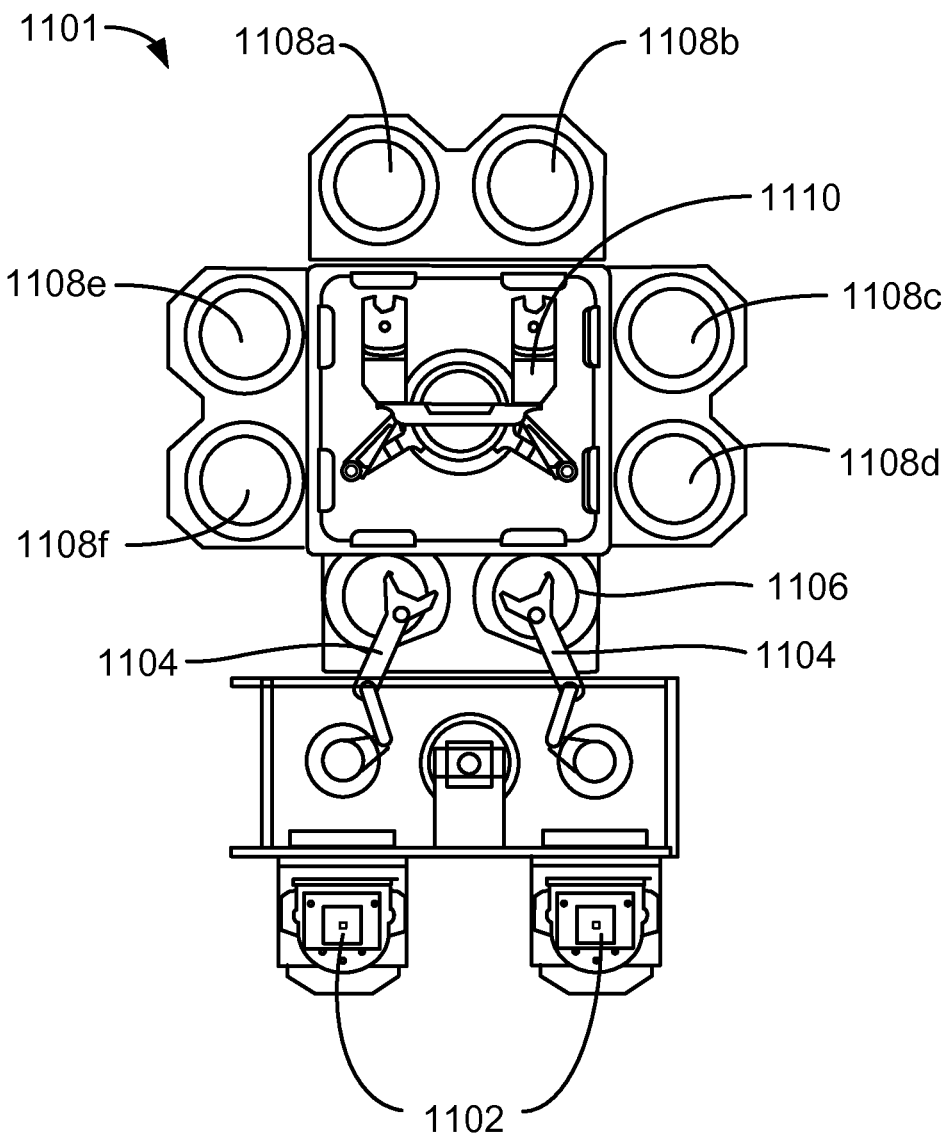
FIG. 4 shows a top view of an exemplary substrate processing system according to embodiments.

Embodiments of the dry etch systems may be incorporated into larger fabrication systems for producing integrated circuit chips. FIG. 4 shows one such processing system (mainframe) 1101 of deposition, etching, baking, and curing chambers in embodiments. In the figure, a pair of front opening unified pods (load lock chambers 1102) supply substrates of a variety of sizes that are received by robotic arms 1104 and placed into a low pressure holding area 1106 before being placed into one of the substrate processing chambers 1108a-f. A second robotic arm 1110 may be used to transport the substrate wafers from the holding area 1106 to the substrate processing chambers 1108a-f and back. Each substrate processing chamber 1108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The showerhead may be referred to as a dual-channel showerhead as a result of the two distinct pathways into the substrate processing region. Radical-fluorine precursor, radical-oxygen precursor and radical-nitrogen-hydrogen precursor (formed by plasma-exciting the fluorine-containing precursor, oxygen-containing precursor and nitrogen-and-hydrogen-containing precursor) may be flowed through the through-holes in the dual-zone showerhead and auxiliary precursors may pass through separate zones in the dual-zone showerhead. The separate zones may open into the substrate processing region but not into the remote plasma region as described above.

Combined flow rates of precursors and plasma effluents into the substrate processing region may account for 0.05% to about 20% by volume of the overall gas mixture; the remainder being carrier gases. The fluorine-containing precursor, the oxygen-containing precursor and the nitrogen-and-hydrogen-containing precursor are flowed into the remote plasma region and the plasma effluents may have the same volumetric flow ratio, in embodiments. A purge or carrier gas may be first initiated into the remote plasma region before those of the fluorine-containing gas, the oxygen-containing precursor and the nitrogen-and-hydrogen-containing precursor to stabilize the pressure within the remote plasma region.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "silicon oxide" of the patterned substrate is predominantly $SiO_2$ but may include concentrations of other elemental constituents such as, e.g., nitrogen, hydrogen and carbon. In some embodiments, silicon oxide portions described herein consist essentially of or only of silicon and oxygen. Exposed "silicon" of the patterned substrate is predominantly Si but may include concentrations of other elemental constituents such as, e.g., nitrogen, hydrogen, oxygen and carbon. In some embodiments, silicon portions described herein consist essentially of or only of silicon. Exposed "silicon nitride" of the patterned substrate is predominantly $Si_3N_4$ but may include concentrations of other elemental constituents such as, e.g., oxygen, hydrogen and carbon. In some embodiments, silicon nitride portions described herein consist essentially of or only of silicon and nitrogen. Exposed "titanium nitride" of the patterned substrate is predominantly titanium and nitrogen but may include concentrations of other elemental constituents such as, e.g., oxygen, hydrogen and carbon. In some embodiments, titanium nitride portions described herein consist essentially of or only of titanium and nitrogen. "Tungsten" of the patterned substrate is predominantly tungsten but may include concentrations of other elemental constituents such as, e.g., oxygen, hydrogen and carbon. In some embodiments, tungsten portions described herein consist essentially of or only of tungsten in embodiments. The definitions of other conducting material follow analogously.

As used herein, a conformal etch process refers to a generally uniform removal of material on a surface in the same shape as the surface, i.e., the surface of the etched layer and the pre-etch surface are generally parallel. A person having ordinary skill in the art will recognize that the etched interface likely cannot be 100% conformal and thus the term "generally" allows for acceptable tolerances.

The term "precursor" is used to refer to any process gas which takes part in a reaction to either remove material from or deposit material onto a surface. "Plasma effluents" describe gas exiting from the chamber plasma region and entering the substrate processing region. Plasma effluents are in an "excited state" wherein at least some of the gas molecules are in vibrationally-excited, dissociated and/or ionized states. A "radical precursor" is used to describe plasma effluents (a gas in an excited state which is exiting a plasma) which participate in a reaction to either remove material from or deposit material on a surface. "Radical-fluorine precursors" describe radical precursors which contain fluorine but may contain other elemental constituents. "Radical-nitrogen-hydrogen precursors" describe radical precursors which contain nitrogen and hydrogen but may contain other elemental constituents. "Radical-oxygen precursors" describe radical precursors which contain oxygen but may contain other elemental constituents. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

Having disclosed several embodiments, it will be recognized by those of skill in the art that various modifications, alternative constructions, and equivalents may be used without departing from the spirit of the disclosed embodiments. Additionally, a number of well-known processes and elements have not been described to avoid unnecessarily obscuring the embodiments described herein. Accordingly, the above description should not be taken as limiting the scope of the claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the embodiments described, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of removing titanium nitride from a patterned substrate, the method comprising:
   placing the patterned substrate in a substrate processing region of a substrate processing chamber;
   flowing a fluorine-containing precursor, an oxygen-containing precursor and a nitrogen-and-hydrogen-containing precursor into a remote plasma region fluidly coupled to the substrate processing region while forming a remote plasma in the remote plasma region to produce plasma effluents;
   flowing the plasma effluents into the substrate processing region through through-holes in a showerhead disposed between the substrate processing region and the remote plasma region; and
   etching the titanium nitride with the plasma effluents.

2. The method of claim 1 wherein a temperature of the patterned substrate is between 200° C. and 300° C. during the operation of etching the titanium nitride.

3. The method of claim 1 wherein an electron temperature within the substrate processing region is below 0.5 eV during the operation of etching the titanium nitride.

4. The method of claim 1 wherein the fluorine-containing precursor comprises one or more of F, $F_2$, $BrF_3$, $ClF_3$, $NF_3$, HF, $SF_6$ and $XeF_2$.

5. The method of claim 1 wherein the nitrogen-and-hydrogen-containing precursor comprises one or more of $NH_3$, $N_2H_4$ or $N_2H_2$.

6. The method of claim 1 wherein the oxygen-containing precursor comprises one or more of $O_2$, O, $O_3$ or $H_2O$.

7. A method of etching titanium nitride from a patterned substrate, the method comprising:
placing the patterned substrate in a substrate processing region of a substrate processing chamber, wherein the patterned substrate has an exposed titanium nitride portion and a titanium-free portion;
flowing a radical-fluorine precursor, a radical-oxygen precursor and a radical-nitrogen-hydrogen precursor into the substrate processing region;
etching the exposed titanium nitride portion such that the exposed titanium nitride portion etches more rapidly than the titanium-free portion by an etch selectivity ratio of more than 10:1, and
exposing the titanium-free portion.

8. The method of claim 7 further comprising an operation of etching a titanium silicide portion disposed between the exposed titanium nitride portion and the titanium-free portion, wherein the titanium silicide portion is in direct contact with the exposed titanium nitride portion and the titanium-free portion, and wherein the operation of etching the titanium silicide portion occurs after etching the exposed titanium nitride portion and before exposing the titanium-free portion.

9. The method of claim 7 wherein a temperature of the patterned substrate is between 30° C. and 500° C. during the operation of etching the exposed titanium nitride portion.

10. The method of claim 7 wherein the substrate processing region is plasma-free during the operation of etching the exposed titanium nitride portion.

11. The method of claim 7 wherein the titanium-free portion is silicon and the etch selectivity ratio exceeds 50:1.

12. The method of claim 7 wherein the titanium-free portion is metal and the etch selectivity ratio exceeds 100:1.

13. The method of claim 7 wherein the titanium-free portion is metal oxide and the etch selectivity ratio exceeds 80:1.

14. A method of removing titanium nitride from a patterned substrate, the method comprising:
placing the patterned substrate in a substrate processing region of a substrate processing chamber, wherein the patterned substrate comprises an exposed titanium nitride portion overlying a silicon nitride portion;
flowing a fluorine-containing precursor, an oxygen-containing precursor and a nitrogen-and-hydrogen-containing precursor into a remote plasma region fluidly coupled to the substrate processing region while forming a remote plasma in the remote plasma region to produce plasma effluents;
flowing the plasma effluents into the substrate processing region through through-holes in a showerhead disposed between the substrate processing region and the remote plasma region; and
etching the titanium nitride with the plasma effluents, wherein etching the titanium nitride with the plasma effluents comprises removing the exposed titanium nitride portion and a titanium silicide portion to expose the silicon nitride portion.

15. The method of claim 14 wherein the titanium silicide portion comprises titanium, nitrogen and silicon.

* * * * *